United States Patent [19]
Hashimoto

[11] Patent Number: 5,874,827
[45] Date of Patent: Feb. 23, 1999

[54] VOLTAGE SUPPLY CIRCUIT FOR A LOAD ABSORBING HIGH TENTATIVE PEAK CURRENT

[75] Inventor: Yoshihiro Hashimoto, Urawa, Japan

[73] Assignee: Advantest Corporation, Tokyo, Japan

[21] Appl. No.: 951,296

[22] Filed: Oct. 16, 1997

[30] Foreign Application Priority Data

Oct. 18, 1996 [JP] Japan ................................. 8-275962

[51] Int. Cl.⁶ ........................................................ G05F 1/10
[52] U.S. Cl. ............................................ 323/234; 323/316
[58] Field of Search .................................. 323/314, 315, 323/234, 316; 326/91; 257/271

[56] References Cited

U.S. PATENT DOCUMENTS

| | | | |
|---|---|---|---|
| 4,441,070 | 4/1984 | Davies et al. | 323/268 |
| 4,683,416 | 7/1987 | Bynum | 323/314 |
| 5,384,498 | 1/1995 | Wong | 326/31 |

*Primary Examiner*—Peter S. Wong
*Assistant Examiner*—Shawn Riley
*Attorney, Agent, or Firm*—Staas & Halsey

[57] ABSTRACT

A voltage supply circuit is provided which is capable of rapidly terminating a fluctuation in the voltage at the voltage output terminal of a feedback type voltage supply and restoring the voltage to a steady-state value. The feedback type voltage supply has a voltage output terminal to which a current supply circuit and a current absorbing circuit are connected. The current supply circuit comprises a voltage source for generating a voltage slightly less than the steady-state voltage at the voltage output terminal, a first diode 33 having a cathode connected to the voltage output terminal, a second diode having a cathode connected to the voltage source, and a current source having a current output terminal connected to the junction between the anodes of the first and the second diode. The current absorbing circuit comprises a voltage source for outputting a voltage slightly above the steady-state voltage at the voltage output terminal, a third diode having an anode connected to the voltage output terminal, a fourth diode having an anode connected to the voltage source, and a current source having a current output terminal connected to the junction between the cathodes of the third and the fourth diode.

9 Claims, 4 Drawing Sheets

5,874,827

VOLTAGE SUPPLY CIRCUIT FOR A LOAD ABSORBING HIGH TENTATIVE PEAK CURRENT

BACKGROUND OF THE INVENTION

1. Field of the Invention

The invention relates to a voltage supply circuit provided with a feedback type voltage supply or source, and in particular, to a voltage supply circuit suitable for use in supplying a given voltage to a load through which an operating or working current having a peak value greater than a steady-state current flows upon inversion of its operation.

2. Description of the Related Art

A general arrangement of an example of the feedback type voltage supply or source which has been used in the prior art is shown in FIG. 3. The illustrated feedback type voltage supply 10 comprises a first operational amplifier 11 having a non-inverting input terminal which is connected to a point of a common potential (ground) and an inverting input terminal which is supplied with a constant voltage Vin from a voltage source 18, a voltage output terminal TO to which a voltage $V_O$ outputted from the operational amplifier 11 is fed through a current measuring resistor 13, a negative feedback circuit connected between the voltage output terminal TO and the inverting input terminal of the operational amplifier 11, the negative feedback circuit including a second operational amplifier 12, a switching element 14 connected in parallel with the resistor, and a phase compensation capacitor 15 also connected in parallel with the resistor 13.

The voltage $V_O$ given to the output terminal TO is supplied to a load 25 as a given operating or working voltage, and is also negatively fed back to the inverting input terminal of the first operational amplifier 11 through the second operational amplifier 12. The voltage source 18 which feeds the constant voltage Vin to the inverting input terminal of the operational amplifier 11 is generally formed by a D/A (digital-analog) converter so that the magnitude of the constant voltage Vin fed to the inverting input terminal of the operational amplifier 11 can be set to an arbitrary value depending upon a digital value given to the D/A converter.

The feedback type voltage supply 10 constructed in the manner mentioned above is often used, as a power supply or source, in a semiconductor device testing apparatus (commonly called IC tester) for testing various kinds of semiconductor devices such as IC memories, for instance, each formed into a semiconductor integrated circuit (hereinafter referred to as IC), the power supply supplying a predetermined operating voltage to semiconductor devices to be tested on testing them.

As illustrated in FIG. 3, the feedback type voltage supply 10 is used in a current measuring circuit for measuring a current flow through a semiconductor device under test as a power supply for applying a given operating voltage to the semiconductor device under test. For this end, there is provided current measuring means 20 including a differential amplifier 21 for taking out a voltage developed across the current measuring resister 13 connected between the first operational amplifier 11 and the voltage output terminal TO, and an A/D (analog-digital) converter 22 for converting a voltage value detected by the differential amplifier 21 into a digital value. However, it should be noted that this shows merely an exemplary one and that the circuit arrangement of the feedback type voltage supply 10 may be changed or modified depending on its application.

When the load 25 which is connected between the output terminal TO of the voltage supply 10 and the common potential point is a semiconductor integrated circuit having a complementary MOS structure (hereafter referred to as CMOS type IC), for example, a current IL flowing through CMIOS type IC changes in a manner illustrated in FIG. 4A each time an active element (field effect transistor) or elements within the CMOS type IC inverts or invert in its or their operation. That is, during a steady-state operation of the IC in which no inverting operation of active elements occurs, a steadystate current ΔI of very small magnitude flows therethrough, and during inverting operation thereof, an operating current IP having a very large magnitude flows therethrough, and upon completion of the inverting operation, the current is restored to the steady-state current ΔI of very small magnitude, again. The ratio of the operating current IP to the steady-state current ΔI is very high, on the order of 1000:1, for example.

Even if the load 25 is not a CMOS type IC, the current flowing through the load 25 changes in the similar manner as illustrated in FIG. 4A where it is one through which an operating current having a peak value greater than the magnitude thereof in the steady-state flows when there occurs an inversion in operation thereof. As a consequence, the voltage $V_O$ given to the voltage output terminal TO from the voltage supply 10 changes in a manner depicted in FIG. 4B, requiring a significant length of time until it is restored to the original steady-state voltage Vin.

As is recognized, an increase in the operating speed of IC is being ever demanded recently, and with an IC which operates at a higher speed or rate, its inverting operation takes place more quickly. It will then be seen that the period during which the operating current IP with a higher magnitude flows is significantly shortened. As the period during which the operating current IP flows is reduced in time, the time interval during which the steady-state current ΔI of very small magnitude flows becomes shortened, resulting in a situation that the operating current IP of a high magnitude occurs again before the steady-state current ΔI can be stabilized. Accordingly, for an IC having a high operation speed, it follows that the current measurement must be made before the steady-state current is stabilized, making it difficult to measure the steady-state current exactly. In addition to the measurement of the steady-state current, there is also a need to return the voltage $V_O$ supplied to the voltage output terminal TO of the voltage supply 10 to the original steady-state voltage Vin quickly to assure a stable operation (or to increase the reliability) of the IC which is operating at a high speed.

For this end, in the current measuring circuit shown in FIG. 3, a bypass capacitor 16 is connected between the output terminal TO and the common potential point (and thus in parallel with the load 25), and is normally charged to the steady-state voltage $V_O$ (and accordingly, to the steady-state voltage Vin), the arrangement being such that when the operating current IP flows through the load 25, the switching element 14 is turned on to bypass the resister 13, thus allowing an increased current flow. Subsequent to the flow of the operating current IP, the switching element 14 is turned off to allow a measurement of the steady-state current ΔI.

However, in order to turn the switching element 14 on as the operating current IP flows and to turn it off subsequent to the flow of the operating current IP, it is necessary that the turn on/off of the switching element 14 be effected in accordance with a change in the current IL flowing through the load 25 in real time, thus presenting a difficulty that a complicated control is required.

As the current IL flows through the load 25, a change in the voltage $V_0$ at the output terminal TO of the voltage supply 10 (namely, a load fluctuation characteristic) is determined by the magnitude of the current IL, the capacitance of the bypass capacitor 16 and the response of the voltage supply 10. To obtain a rapid load fluctuation characteristic, it is necessary to increase the frequency response of the voltage supply 10, thus accelerating the response. On the other hand, it is necessary to choose a small capacitance for the bypass capacitor 16 in order to increase the frequency response of the voltage supply 10.

As the operating current IP flows, the initial current is fed to the load 25 from the bypass capacitor 16. If the bypass capacitor 16 has a reduced capacitance, the reduced stored charge causes an increased initial voltage change $\Delta V_0$ in the voltage $V_0$ at the output terminal TO. In such case, because of the increased frequency response of the voltage supply 10, a time interval during which the voltage $V_0$ continues to change (or a time interval from the beginning of a change in the voltage $V_0$ until it resumes the original steady-state voltage Vin) is relatively short. However, there is a limit on the degree to which the response of the voltage supply 10 can be accelerated with a reduction in the capacitance of the bypass capacitor 16 alone. It then follows that the circuit cannot be used as a power supply for a load which operates with a degree of rapidness.

By contrast, when an increased capacitance is chosen for the bypass capacitor 16, the initial voltage change $\Delta V_0$ in the voltage $V_0$ at the output terminal TO can be reduced as the operating current IP flows. However, because the frequency response of the voltage supply 10 is decreased, its response becomes retarded, resulting in an increased length of time during which the voltage $V_0$ continues to change. Hence, it cannot be used as a power supply for a load which operates rapidly.

SUMMARY OF THE INVENTION

It is an object of the invention to provide a voltage supply circuit capable of rapidly terminating a fluctuation in a voltage appearing at a voltage output terminal of a feedback type voltage supply and restoring it to a steady-state voltage value.

The above object is achieved in accordance with the invention by providing a voltage supply circuit comprising: a feedback type voltage supply provided with a feedback circuit, for supplying a predetermined voltage to a load; a current supply circuit connected to a voltage output terminal of the voltage supply, for detecting when the voltage at the voltage output terminal is reduced below a steady-state value, thereby to cause a current to flow into the voltage output terminal; and a current absorbing circuit connected to the voltage output terminal of the voltage supply, for detecting when the voltage at the voltage output terminal rises above the steady-state value, thereby to absorb a current from the voltage output terminal.

In a preferred embodiment of the voltage supply circuit according to the invention, the current supply circuit comprises a voltage source for outputting a voltage slightly less than the magnitude of a steady-state voltage supplied to the voltage output terminal of the voltage supply, a diode having an anode to which the voltage from the voltage source is applied and a cathode connected to the voltage output terminal, and a current source connected to the junction between the anode of the diode and the voltage source, for causing a current to flow into the voltage output terminal through the diode at a time when the voltage at the voltage output terminal is reduced below the voltage from the voltage source.

It is preferred that the current supply circuit further comprises a second diode having a cathode to which the voltage from the voltage source is applied and an anode which is connected to the junction between the anode of the first mentioned diode and the voltage source.

In another preferred embodiment of the voltage supply circuit according to the invention, the current absorbing circuit comprises a voltage source for outputting a voltage slightly above the magnitude of the steady-state voltage supplied to the voltage output terminal of the voltage supply, a diode having a cathode to which the voltage from the voltage source is applied and an anode connected to the voltage output terminal, and a current source connected to the junction between the cathode of the diode and the voltage source, for absorbing a current from the voltage output terminal at a time when the voltage at the voltage output terminal rises above the voltage from the voltage source.

It is preferred that the current absorbing circuit further comprises a second diode having an anode to which the voltage from the voltage source is applied and a cathode which is connected to the junction between the cathode of the first mentioned diode and the voltage source.

With the voltage supply circuit as defined in claim 1, when a voltage at the voltage output terminal changes in a decreasing direction as a result of a flow of an operating current IP having a greater peak value through an IC which becomes a load, a decrease in the voltage is detected by a current supply circuit which is separate from the voltage supply, and which supplies a current to the voltage output terminal. This current supply is effective to allow the current which has been suDplied from only the voltage supply to be supplemented by the current supply circuit also, thus allowing an initial change in the voltage at the voltage output terminal to be suppressed. As a consequence, a time interval over which the voltage at the voltage output terminal changes can be reduced in time. Accordingly, if the load is an IC operating at a high speed, the voltage supply circuit according to the invention can be used as a power source for such a rapidly operating load with a high reliability.

In the voltage supply circuit as defined in claim 1, the voltage output terminal of the voltage supply is connected to a current drawing circuit which detects any rise in the voltage at the voltage output terminal above a steady-state voltage and draws a current in response. Accordingly, if the voltage at the voltage output terminal overshoots when the operating current flows through the load and is then interrupted before returning to a steady-state current, such overshoot is detected by the current drawing circuit, which then draws a current from the voltage output terminal. Drawing the current in this manner is effective to limit the overshoot, and hence the voltage at the voltage outDut terminal is allowed to resume the steady-state voltage at an early point in time, thus reducing the length of a time interval over which the voltage at the voltage output terminal changes if an overshoot should occur.

With the voltage supply circuit according to the invention, the current supply circuit and the current drawing circuit both connected to the voltage output terminal of the voltage supply are each a current source, which exhibits a high impedance. Accordingly, they have no influence whatsoever upon the characteristic of the feedback type voltage supply. This means that various forms of conventional voltage supplies of feedback type can be directly used, without requiring any change or modification in the circuit arrangement of conventional feedback type voltage supply while allowing the characteristic of the feedback type voltage supply to be improved by merely applying the present invention.

DETAILED DESCRIPTION OF THE PREFERRED EMBODIMENT

Figure 1:
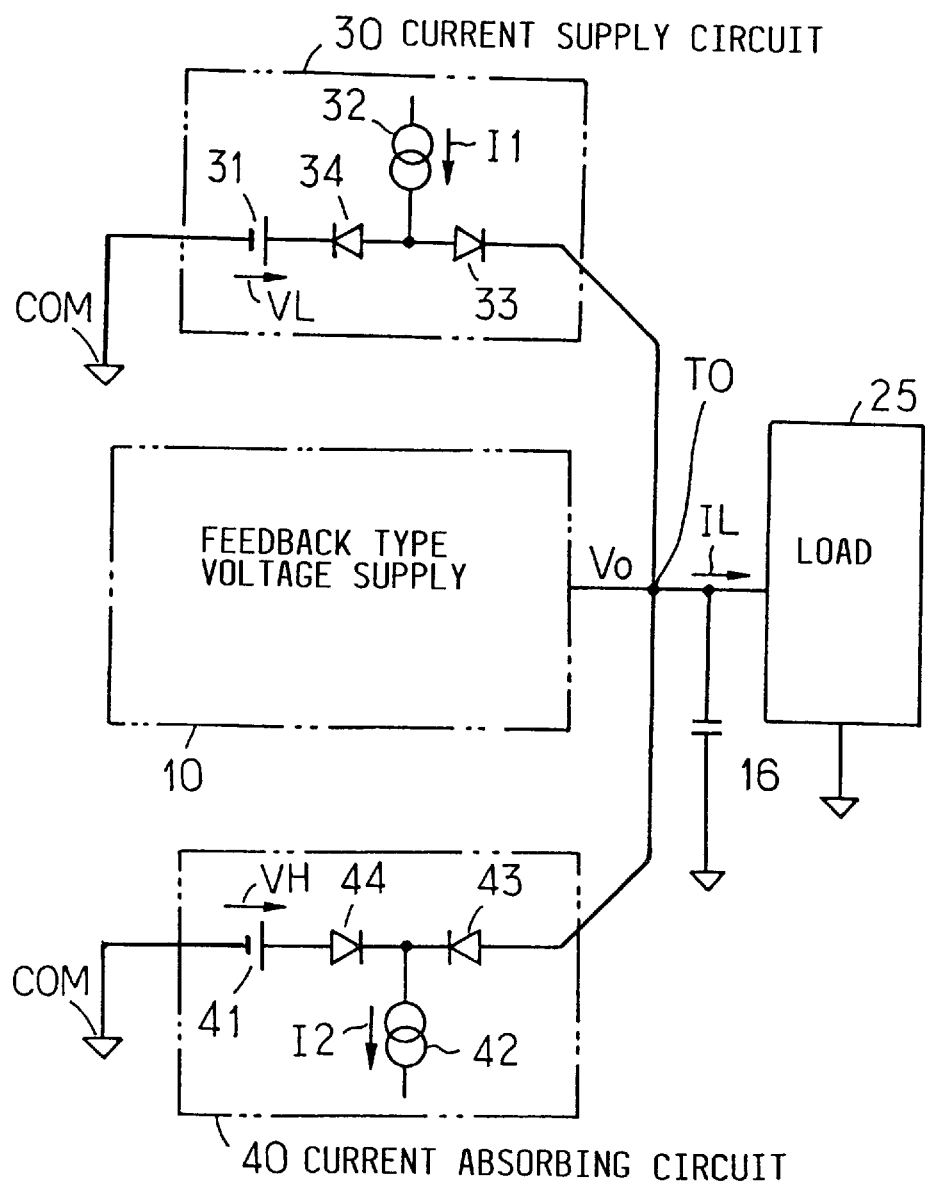
FIG. 1 is a circuit diagram of a voltage apply circuit according to one embodiment of the invention.
Figure 3:
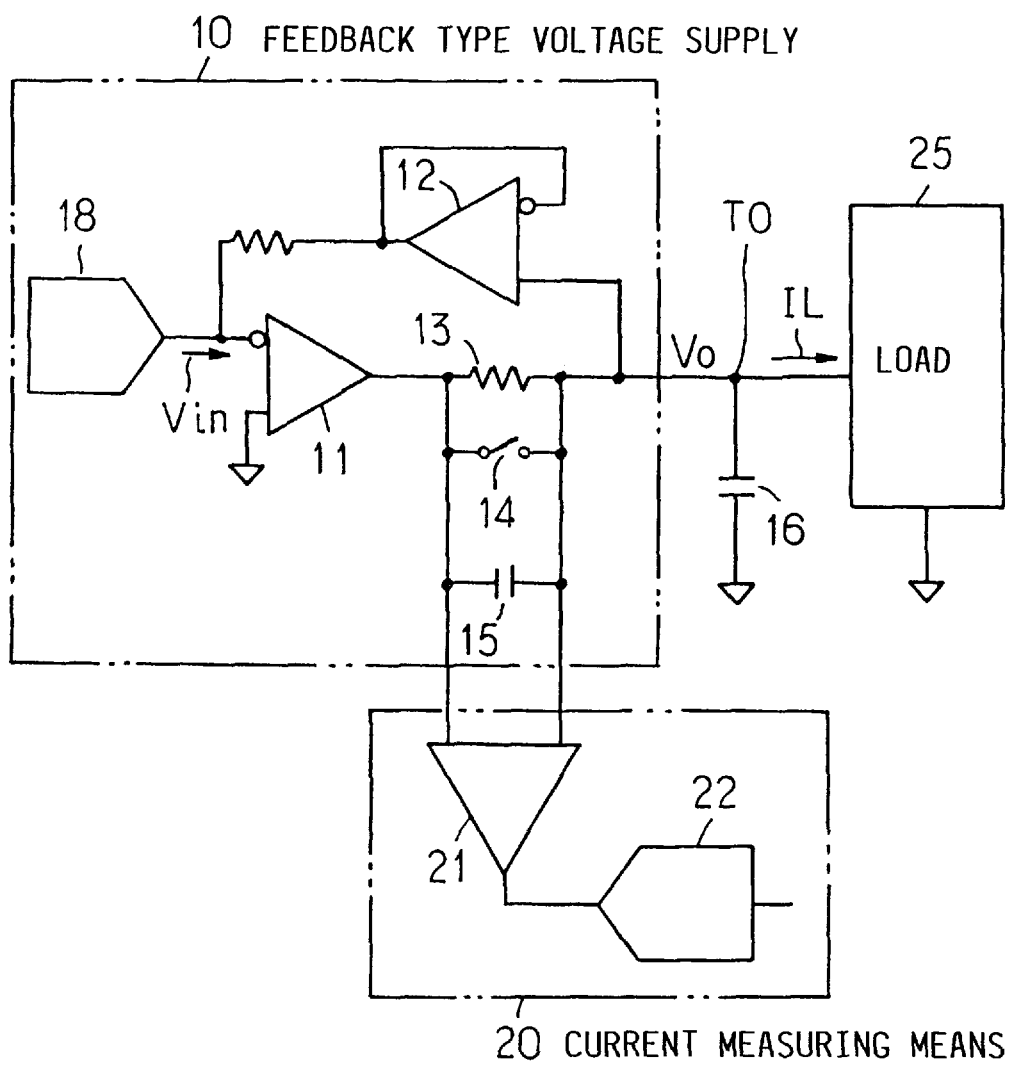
FIG. 3 is a circuit diagram of a feedback type voltage supply used in a conventional current measuring circuit.
Figure 4:
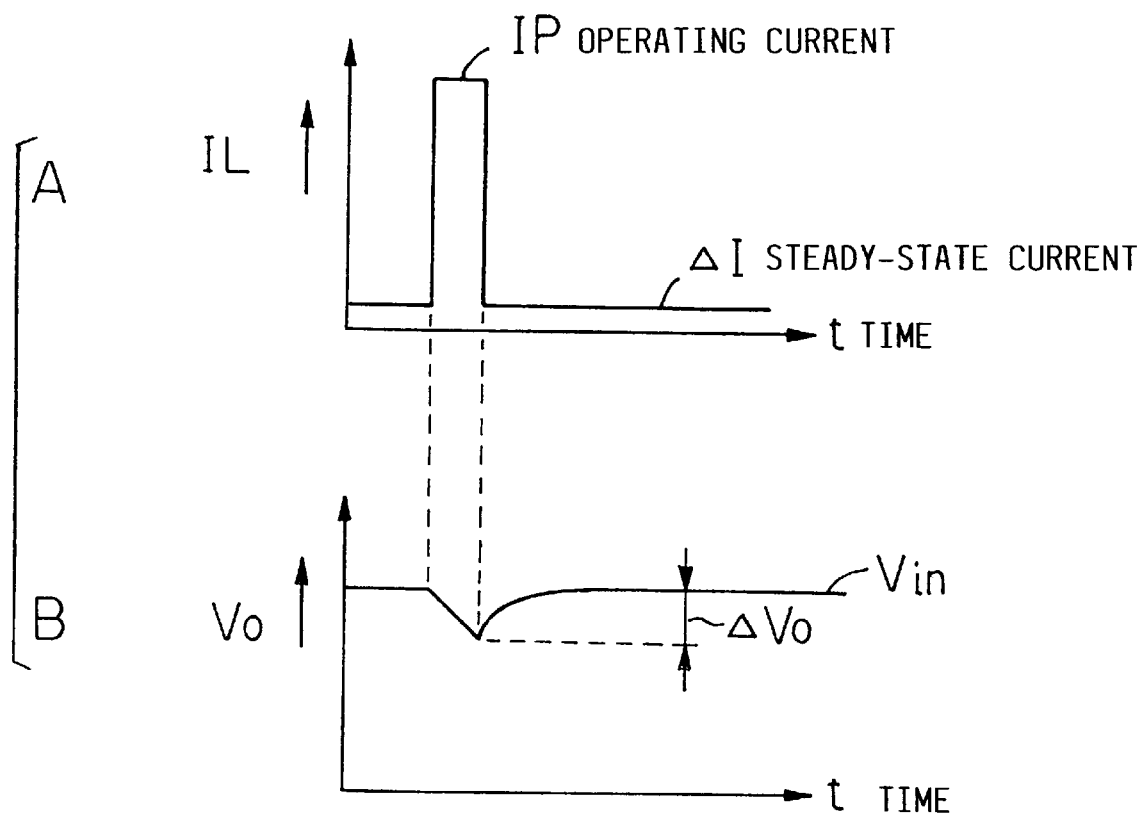
FIGS. 4 A–B shows waveform diagrams illustrating the operation of the voltage supply shown in FIG. 3.

Referring to the drawings, a voltage supply circuit according to one embodiment of the invention will now be described. FIG. 1 shows the voltage supply circuit of the embodiment, and it is to be noted that corresponding parts to those shown in FIG. 3 are designated by like reference numerals and characters in FIG. 1 as used in FIG. 3 and will not be described again unless a need to repeat is found necessary.

Since any one of various circuit arrangements known in the art can be used for a feedback type voltage supply 10, the circuit arrangement will not be specifically shown. When it is desired to use the voltage supply circuit of the invention as a power supply in a current measuring circuit which measures a minute steady-state current passing through a semiconductor device, a feedback type voltage supply having a circuit arrangement as shown at 10 in FIG. 3 may be used, but there is no need to provide the switching element 14.

In the embodiment of the invention, a current supply circuit 30 and a current absorbing or drawing circuit 40 are connected to a voltage output terminal TO of the voltage supply 10. The current supply circuit 30 comprises a voltage source 31 for generating a voltage VL slightly less than the magnitude of the steady-state voltage $V_0$=Vin at the voltage output terminal TO of the voltage supply 10, a first diode 33 having an anode to which the voltage VL from the voltage source 31 is applied and a cathode connected to the voltage output terminal TO, a second diode 34 having an anode connected to the anode of the first diode 33 and a cathode connected to the voltage source 31, and a first current source 32 having a current output terminal which is connected to the junction between the anode of the first diode 33 and the anode of the second diode 34.

The current absorbing circuit 40 comprises a voltage source 41 for generating a voltage VH slightly above the steady-state voltage $V_0$=Vin at the voltage output terminal of the voltage supply 10, a third diode 43 having a cathode to which the voltage VH from the voltage source 41 is applied and an anode connected to the voltage output terminal TO, a fourth diode 44 having a cathode connected to the cathode of the third diode 43 and an anode connected to the voltage source 41, and a second current source 42 having a current output terminal which is connected to the junction between the cathode of the third diode 43 and the cathode of the fourth diode 44.

Figure 2:
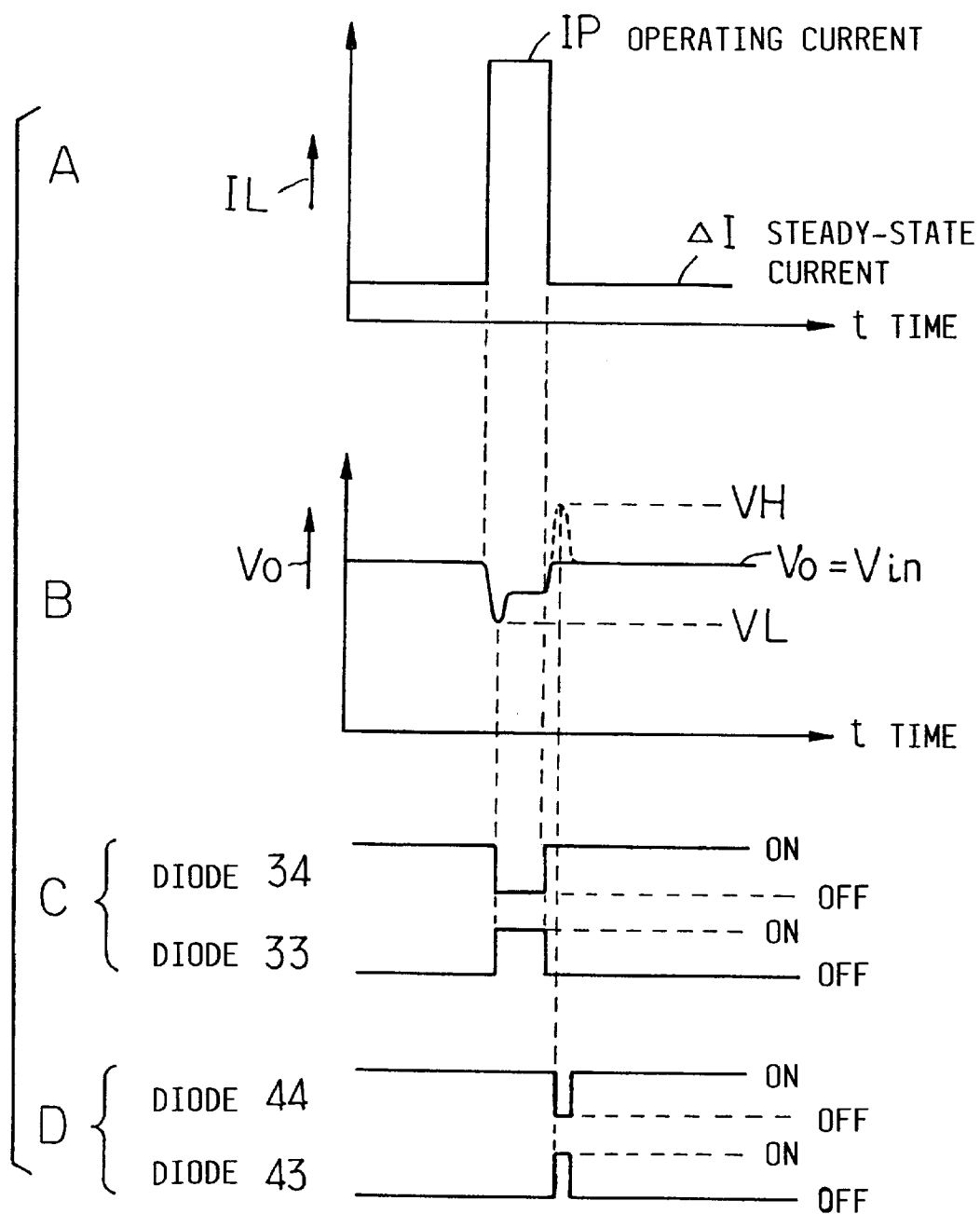
FIGS. 2 A–D shows waveform diagrams illustrating the operation of the voltage supply circuit shown in FIG. 1.

Under the steady-state condition when the voltage at the voltage output terminal OT assumes $V_0$=Vin, the second diode 34 in the current supply circuit 30 and the fourth diode 44 in the current absorbing circuit 40 are maintained on, as indicated in FIGS. 2C and 2D, respectively, while the first diode 33 in the current supply circuit 30 and the third diode 43 in the current absorbing circuit 40 are maintained off. Accordingly, a current I1 supplied from the first current source 32 in the current supply circuit 30 flows to a point of common potential COM through the second diode 34 and the voltage source 31. Also, a current I2 drawn by the second current source 42 in the current absorbing circuit 40 is drawn from the point of common potential COM into the current source 42 through the voltage source 41 and the fourth diode 44.

Under this condition, if the load 25 undergoes a inversion in operation (for example, when the load 25 represents a CMOS TYPE IC and its active element, which is a field effect transistor, reverses its operation) to cause a high operating current IP to flow through the load 25, as indicated in FIG. 2A, the voltage $V_0$ at the voltage output terminal TO will be depressed in a manner illustrated in FIG. 2B. When the voltage $V_0$ at the voltage output terminal TO is reduced below the voltage VL from the voltage source 31, the second diode 34 in the current supply circuit 30 will be turned off while the first diode 33 will be turned on, as indicated in FIG. 2C, whereby the current I1 fed from the first current source 32 is injected into the voltage output terminal TO.

As a result of the current injection from the current supply circuit 30 to the voltage output terminal TO, the bypass capacitor 16 is charged by the current I1, whereby the initial voltage change $\Delta V_0$ is clamped so as to prevent a reduction below the level of the voltage VL. Consequently, the magnitude of the initial voltage change $\Delta V_0$ at the voltage output terminal TO is suppressed to a small value of voltage which is determined by the voltage VL from the voltage source 31. Because the initial voltage change $\Delta V_0$ is suppressed to a small value, the voltage at the voltage output terminal TO is rapidly restored to the original steady-state voltage of $V_0$=Vin subsequent to the flow of the operating current IP. In this manner the steady-state voltage $V_0$=Vin is resumed in a very brief time interval from the occurrence of the initial change. Accordingly, the voltage supply circuit of the invention can be used as a power supply for a load which may be an IC operating at a high rate, with a high reliability.

Since the current injection from the current supply circuit 30 to the voltage output terminal TO allows the magnitude of the initial voltage change at the voltage output terminal TO to be suppressed to a small value and allows the voltage at the voltage output terminal TO to resume the steady-state value of $V_0$=Vin in a very brief time interval from the occurrence of the initial change, it is possible to reduce the capacitance of the bypass capacitor 16, thereby bringing forth an advantage that the frequency response of the voltage supply 10 can be enhanced.

On the other hand, if the amount of current injection from the current supply circuit 30 is excessive at the termination of flow of the operating current IP through the load 25, an overshoot may occur, or the voltage at the voltage output terminal TO may rise transiently as indicated by broken lines in FIG. 2B. in the present embodiment, in the event the overshoot occurs and when the overshoot voltage exceeds the voltage VH from the voltage source 41 in the current absorbing circuit 40, the forth diode 44 in the current absorbing circuit 40 is turned off while the third diode 43 is turned on, thus activating the current absorbing circuit 40 to cause the current source 42 therein to absorb a current I2 from the voltage output terminal TO. Drawing the current in this manner is effective to clamp the overshoot voltage at a level of the voltage VH from the voltage source 41 which is slightly above the steady-state voltage Vin, and thus the overshoot voltage cannot rise above the voltage VH. As a consequence, the voltage at the voltage output terminal TO rapidly resumes the original steady-state voltage $V_O=Vin$, thus resuming the steady-state value of $V_O=Vin$ in a very brief time interval from the occurrence of the initial change. Accordingly, the voltage supply circuit of the invention enables the voltage at the voltage output terminal TO to be rapidly restored to the original steady-state value of $V_O=Vin$ in the event of occurrence of an overshoot.

As described, the invention affords a remarkable advantage that a mere addition of the current supply circuit 30 and the current absorbing circuit 40 to a conventional feedback type voltage supply in any one of a variety of configurations allows it to be converted into a voltage supply circuit having an improved characteristic which can accommodate for a load which operates at a high rate, without changing the performance of the voltage supply itself.

Subsequent to the termination of flow of the operating current IP, the diodes 33 and 43 are rapidly turned off, and hence the current supply circuit 30 and the current absorbing circuit 40 can no longer deliver a current to or absorb a current from the voltage output terminal of the voltage supply. Thus, only the high speed response is required of the current sources 32, 42 and the voltage sources 31, 41 in the both circuits, and no requirement on the low noise characteristic and high precision voltage stability is placed on them. Accordingly, the circuit arrangement can be simplified, and the manufacture is facilitated in an inexpensive manner. In addition, since both the current supply circuit 30 and the current absorbing circuit 40 are essentially current sources, they exhibit high impedances, which avoid any influence upon the characteristic of the voltage supply. Thus, an advantage is also gained that the voltage supply circuit of the invention can be manufactured in a facilitated manner and inexpensively.

The current supplying and absorbing capacity of the current supply circuit 30 and the current absorbing circuit 40 which are used in the voltage supply circuit of the invention can be enhanced as required, thus allowing an accommodation for a variety of loads which have varying magnitudes of a current which flows upon inversion in operation. Where a plurality of voltage output terminals are provided for a feedback type voltage supply in order to permit a supply of an increased amount of current to a load, it is only necessary to increase the number of current supply circuits 30 and current absorbing circuits 40 in a corresponding manner, thus allowing an accommodation for any kind of feedback type voltage supply.

Thus it will be seen that the voltage supply circuit of the invention has a remarkable advantage that it can be used as a stable power supply for applying a given operating voltage to a semiconductor device to be tested in an IC tester or as a stable power supply for applying a given operating voltage to a semiconductor device to be tested in a current measuring circuit which determines a minute steady-state current of the semiconductor device, for example, for any variety of semiconductor device inclusive of a semiconductor device operating at a high rate.

What is claimed is:

1. A voltage supply circuit having a voltage output terminal to which a load is coupled, comprising:
    a feedback type voltage supply comprising a feedback circuit, and connected to the voltage output terminal and supplying an output voltage of a predetermined level to the voltage output terminal;
    a current supply circuit connected to the voltage output terminal of the voltage supply circuit, said current supply circuit comprising:
    a first current source,
    means for generating a lower reference voltage which is lower than the predetermined level of the output voltage, and
    means for causing a current to flow from said first current source into the voltage output terminal when the output voltage at the voltage output terminal is tentatively reduced below the lower reference voltage; and
    a current absorbing circuit connected to the voltage output terminal of the voltage supply circuit, said current absorbing circuit comprising:
    a second current source,
    means for generating a higher reference voltage which is higher than the predetermined level of the output voltage, and
    means for causing a current to flow from the voltage output terminal into said second current source when the output voltage at the voltage output terminal tentatively rises above the higher reference value;
    whereby an irregular increase or decrease in the output voltage at the voltage output terminal caused by tentative peak current flow or overshoots in a load current flowing the load is quickly suppressed to resume the predetermined value.

2. The voltage supply circuit according to claim 1, wherein
    said means for generating a lower reference voltage of the current supply circuit comprises a first voltage source outputting the lower reference voltage slightly less than the predetermined value of the output voltage supplied to the voltage output terminal of the voltage supply circuit;
    said means for causing a current to flow from said first current source into the voltage output terminal of the current supply circuit comprises a first diode having an anode connected to the first voltage source and a cathode connected to the voltage output terminal; and
    said first current source is connected to a junction between the anode of the first diode and the first voltage source, causing a current to flow from the first current source into the voltage output terminal through the first diode when the output voltage at the voltage output terminal is tentatively reduced below the lower reference voltage of the first voltage source.

3. The voltage supply circuit according to claim 2, wherein the current supply circuit further comprises a second diode having a cathode connected to and an anode connected to a junction between the anode of the first diode and the first current source.

4. A voltage supply circuit according to claim 1, wherein
    said means for generating a higher reference voltage of the current absorbing circuit comprises a second voltage source for outputting the higher reference voltage slightly above the predetermined value of the output voltage supplied to the voltage output terminal of the voltage supply circuit;
    said means for causing a current to flow from the voltage output terminal into said second current source of the current absorbing circuit comprises a third diode having a cathode connected to the second voltage source and an anode connected to the voltage output terminal; and said second current source is connected to a junction between the cathode of the third diode and the second voltage source, absorbing a current from the voltage output terminal through the third diode when the output voltage at the voltage output terminal tentatively rises above the higher reference voltage of the second voltage source.

5. The voltage supply circuit according to claim 4, wherein the current absorbing circuit further comprises a fourth diode having an anode connected to the second voltage source and a cathode connected to a junction between the cathode of the third diode and the second current source.

6. The voltage supply according to claim 1, wherein the load is a semiconductor integrated circuit through which an operating current having a peak value greater than the predetermined level of the output voltage flows when the operation thereof is inverted.

7. The voltage supply circuit according to claim 1, wherein the load is a semiconductor integrated circuit having a complementary MOS structure.

8. A voltage supply circuit comprising:
- a feedback type voltage supply comprising a feedback circuit and supplying an output voltage of a predetermined level from a voltage output terminal thereof to a load;
- a current supply circuit connected to the voltage output terminal of the voltage supply and causing a current to flow into the voltage output terminal when the output voltage at the voltage output terminal is tentatively reduced below a lower reference voltage which is slightly less than the predetermined level, wherein the current supply circuit comprises:
  - a first voltage source outputting the lower reference voltage,
  - a first diode including an anode coupled to the first voltage source and a cathode coupled to the voltage output terminal, and
  - a first current source coupled to a junction between the anode of the first diode and the first voltage source and causing a current to flow from the first current source into the voltage output terminal through the first diode when the output voltage at the voltage output terminal is tentatively reduced below the lower reference voltage of the first voltage source; and
- a current absorbing circuit coupled to the voltage output terminal of the voltage supply and absorbing a current from the voltage output terminal when the output voltage at the voltage output terminal tentatively rises above a higher reference voltage which is slightly higher than the predetermined level.

9. A voltage supply circuit comprising:
- a feedback type voltage supply comprising a feedback circuit and supplying an output voltage of a predetermined level from a voltage output terminal thereof to a load;
- a current supply circuit coupled to the voltage output terminal of the voltage supply and causing a current to flow into the voltage output terminal when the output voltage at the voltage output terminal is tentatively reduced below a lower reference voltage which is slightly less than the predetermined level; and
- a current absorbing circuit coupled to the voltage output terminal of the voltage supply and absorbing a current from the voltage output terminal when the output voltage at the voltage output terminal tentatively rises above a higher reference voltage which is slightly higher than the predetermined level, wherein the current absorbing circuit comprises:
  - a first voltage source outputting the higher reference voltage,
  - a first diode including a cathode coupled to the first voltage source and an anode coupled to the voltage output terminal, and
  - a first current source coupled to a junction between the cathode of the first diode and the first voltage source and causing a current to flow from the voltage output terminal into the first current source through the first diode when the output voltage at the voltage output terminal is tentatively rises above the higher reference voltage of the first voltage source.

* * * * *

UNITED STATES PATENT AND TRADEMARK OFFICE
CERTIFICATE OF CORRECTION

PATENT NO.: 5,874,827
DATED : February 23, 1999
INVENTOR(S): Hashimoto

It is certified that error appears in the above-identified patent and that said Letters Patent is hereby corrected as shown below:

Title Page [57], Abstract, line 9, after "diode" delete "33".

Col. 2,
    line 11, "steadystate" should be --steady-state--.

Col. 4,    line 35, "suDplied" should be --supplied--;
    line 55, "outDut" should be --output--.

Col. 6,    line 35, "A $V_o$" should be --$\Delta V_o$--.

Col. 8,    line 52, after "to" insert --the first voltage source--.

Signed and Sealed this

Ninth Day of November, 1999

Attest:

Q. TODD DICKINSON

*Attesting Officer*    *Acting Commissioner of Patents and Trademarks*